United States Patent [19]
Baker et al.

[11] Patent Number: 6,072,843
[45] Date of Patent: Jun. 6, 2000

[54] METHOD AND APPARATUS FOR SIGMA-DELTA DEMODULATOR WITH APERIODIC DATA

[75] Inventors: James Clark Baker, Crystal Lake; John Paul Oliver, Chicago; Nectar Andrew Kirkiris, Palatine, all of Ill.

[73] Assignee: Motorola, Inc., Schaumburg, Ill.

[21] Appl. No.: 09/013,877

[22] Filed: Jan. 27, 1998

[51] Int. Cl.[7] .............................. H03D 1/00; H04L 27/00; H03M 3/00; H03M 1/00

[52] U.S. Cl. .......................... 375/340; 375/247; 341/126; 341/143; 341/144

[58] Field of Search ..................................... 341/126, 143, 341/144; 375/247, 340

[56] References Cited

U.S. PATENT DOCUMENTS

| | | | |
|---|---|---|---|
| 5,055,800 | 10/1991 | Black et al. | 331/1 A |
| 5,504,751 | 4/1996 | Ledzius et al. | 341/144 |
| 5,859,605 | 1/1999 | Raghavan et al. | 341/143 |

*Primary Examiner*—Stephen Chin
*Assistant Examiner*—Michael W. Maddox
*Attorney, Agent, or Firm*—Paul J. Bartusiak

[57] ABSTRACT

According to the present disclosure, aperiodic data is applied to parallel register (500). When a predetermined relationship between an aperiodic load signal and a periodic oversample clock signal occurs, the aperiodic data is latched to the output (506) of the parallel register as substantially periodic data. The substantially periodic data is loaded into a sigma-delta DAC (502) for processing. The sigma-delta DAC (502) is driven by a periodic oversample clock to produce a 1-bit oversampled, time averaged representation of the substantially periodic data.

18 Claims, 5 Drawing Sheets

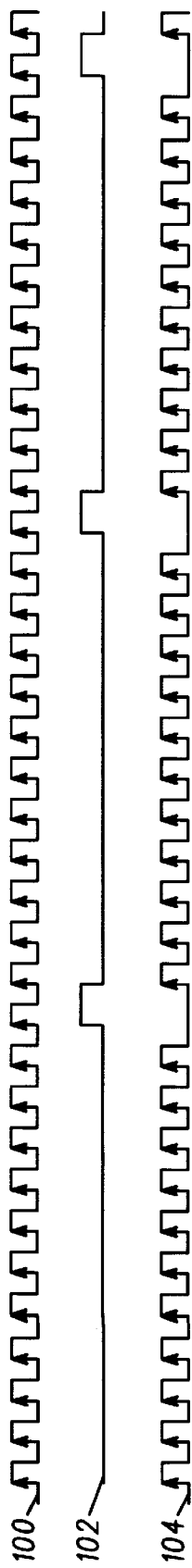
FIG. 1 — PRIOR ART —
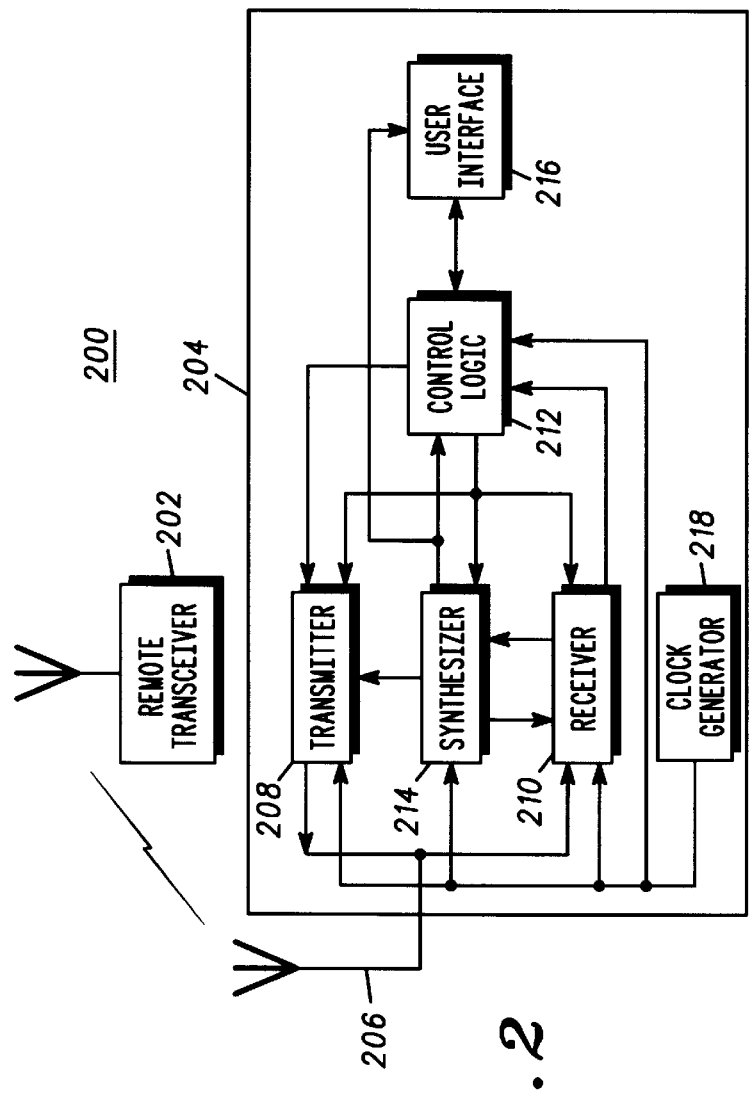
FIG. 2

6,072,843

METHOD AND APPARATUS FOR SIGMA-DELTA DEMODULATOR WITH APERIODIC DATA

FIELD OF THE INVENTION

This invention relates generally to demodulators, and more particularly to a method and apparatus for sigma-delta demodulation utilizing an aperiodic clock.

BACKGROUND OF THE INVENTION

In many digital communication systems, the choice of various clocking frequencies is critical to the performance of the overall system. Typically a crystal oscillator is used for generating a master clock. A crystal oscillator is used because of its high precision and low frequency drift versus temperature. To generate multiple clock frequencies, some systems use two or more crystal oscillators. This adds additional size and cost to the system, which is highly undesirable for wireless communication systems such as cellular telephony.

Other systems use various clock generation techniques in order to achieve the proper multiple clock frequencies. One of these techniques is to use a binary rate multiplier (BRM) to generate a ratio of the master clock frequency from which all other clock frequencies can be generated. A clock is generated with a BRM by gating off certain clock pulses of the master clock in order to achieve the correct ratio for the generated clock. Thus a BRM generated subclock is a time average version of the target subclock frequency.

FIG. 1 is a timing diagram example of the generation of a BRM clock. The BRM generated clock is created using a 32/35 ratio to produce a 7.68 MHz clock from an 8.4 MHz clock reference. Signal 100 represents a periodic 8.4 MHz clock, and signal 102 is a clock off signal to gate off every 12th, 24th, and 35th rising edge of the signal 100 periodic clock. Signal 104 represents the aperiodic 7.68 MHz, BRM generated clock. The resulting 7.68 MHz clock is aperiodic because every 11th, 23rd, and 34th pulses are one additional master clock period wide. In addition, any subclocks generated from this BRM master clock will also be aperiodic in nature.

In a communication system employing digital demodulation, a sigma-delta digital-to-analog converter (DAC) can be used to generate an analog representation of the digital signal. The output of a sigma-delta DAC is a 1-bit oversampled, time averaged representation of a digital signal with in-band noise that is inversely related to the oversampling ratio (OSR). The OSR is defined to be the ratio of the oversampling frequency to the sampling frequency. For a first order sigma-delta DAC, each doubling of the OSR reduces the signal band noise by 9 dB. Because the output of a sigma-delta DAC is a time averaged representation of a digital signal, the use of an aperiodic sampling frequency greatly degrades the quality of the signal that is being output.

The signal degradation occurs because, in order to reconstruct the analog signal, a continuous stream of pulses with equal magnitude are generated by the sigma-delta DAC. For example, a binary 1 output is mapped to a +1 pulse and a binary 0 is mapped to a −1 pulse. The pulses are then time-averaged (low-pass filtered) to produce the reconstructed analog signal. However, for the signal to be properly reconstructed, each pulse must be of equal area. A BRM generated aperiodic clock that drives a sigma-delta DAC does not have equal area pulses.

There is a need for a sigma-delta demodulator that can demodulate data generated by an aperiodic clock. Further, the sigma-delta demodulator must not substantially degrade noise and distortion performance beyond that which would otherwise be obtained by driving the sigma-delta demodulator with periodic clock generated data. Such a demodulator would reduce circuit complexity, reduce the number of crystal oscillators needed for a communication system, maintain proper communication system performance, and reduce the cost of the communication system.

BRIEF DESCRIPTION OF THE DRAWINGS

FIG. 1 is a timing diagram exemplifying a prior art BRM generated clock signal;

FIG. 2 is a block diagram of a radiotelephone which may employ a sigma-delta demodulator apparatus;

DETAILED DESCRIPTION OF A PREFERRED EMBODIMENT

Figure 3:
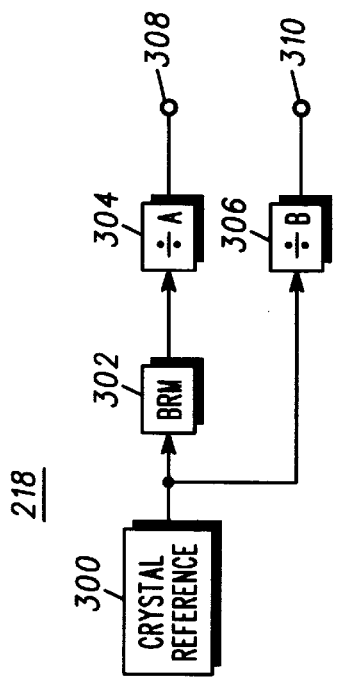
FIG. 3 is a block diagram that exemplifies the generation of periodic and aperiodic clock signals from a crystal reference.

Aperiodic data produced with a BRM generated clock is applied to an input of a parallel register. The aperiodic data is converted to substantially periodic data at an output of the parallel register when a predetermined relationship between an aperiodic load signal and a periodic oversample clock signal occurs. The substantially periodic data appearing at the output of the parallel register is applied to a sigma-delta digital-to-analog converter that is driven by the periodic oversample clock signal and converted to an analog signal.

FIG. 2 is an illustration in block diagram from of a radiotelephone communication system. The radiotelephone communication system 200 includes a remote transceiver 202 and one or more radiotelephones such as radiotelephone 204. The remote transceiver 202 sends and receives RF signals to and from radiotelephones within a fixed geographic area. The radiotelephone 204 is one such radiotelephone contained within the geographic area and includes an antenna 206, a transmitter 208, a receiver 210, a control logic 212, a synthesizer 214, and a user interface 216.

To transmit RF signals containing transmit data from the radiotelephone 204 to the remote transceiver 202, the user interface 216 directs user input data to the control logic 212. The control logic 212 typically includes a microprocessor, memory, a clock generator, and a power amplifier control circuit. The control logic 212 formats the transmit data obtained from the user interface 216 and conveys it to the transmitter 208 for conversion into RF modulated signals. The transmitter 208 conveys the RF modulated signals to the antenna 206 for transmission to the remote transceiver 202.

The radiotelephone 204 detects RF signals containing receive data through the antenna 206 and produces detected RF signals. The receiver 210, coupled to the antenna 206, converts the detected RF signals into electrical baseband signals, demodulates the electrical baseband signals, recovers the receive data, including automatic frequency control information, and outputs the receive data to the control logic 212. The control logic 212 formats the data into recognizable voice or data information for use by user interface 216. The user interface 216 communicates the received information or voice to a user. Typically, the user interface 216 includes a microphone, a speaker, a display, and a keypad.

The synthesizer 214 generates RF signals for use by the receiver 210 and the transmitter 208 to allow the reception and transmission of data. Control over functions of the transceiver, such as channel of operation frequency, is provided by the control logic 212, and is applied, in part, to the synthesizer 214 as synthesizer program instructions.

Clock generator 218 comprises a crystal oscillator for generating a master clock signal having a master clock frequency. The clock generator 218 generates clock signals necessary for operation of the radiotelephone 204.

FIG. 3 is a block diagram that exemplifies the generation of periodic and aperiodic clock signals from clock generator 218. Crystal reference 300 generates a periodic reference signal that is applied to BRM 302. The BRM 302 generates an aperiodic signal, also referred to as binary rate multiplied signal, which is further conditioned by applying to a first divider circuit 304 to produce an aperiodic sample rate clock signal at port 308. The reference signal generated by crystal reference 300 is applied directly to a second divider circuit 306 to produce a periodic oversample clock signal at port 310.

As an example, the crystal reference 300 generates a periodic reference signal at 8.4 MHz. The BRM 302 has a multiplication ratio of 32/35 to produce an aperiodic signal of 7.68 MHz. The 7.68 MHz aperiodic signal is applied to the first divider circuit 304 to divide the 7.68 MHz aperiodic signal by a factor of 240 (A=240) to produce an aperiodic sample rate clock signal at 32 KHz. The 8.4 MHz periodic reference signal is applied directly to the second divider circuit 306 to divide the reference signal by four (B=4) to produce a 2.1 MHz periodic oversample clock signal. This results in an OSR of 2.1 MHz/32 KHz=65.625.

Figure 4:
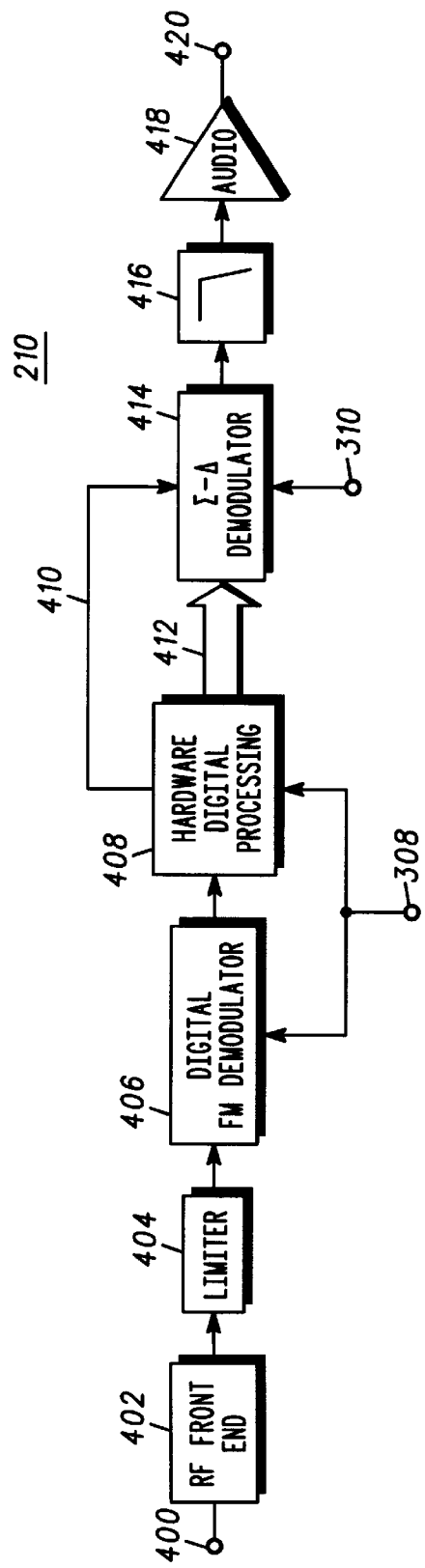
FIG. 4 is a block diagram of a receiver which may employ a sigma-delta demodulator apparatus.

A basic block diagram of the receiver 210 employing the sigma-delta demodulator apparatus 300 is generally shown in FIG. 4. A radio frequency (RF) frequency modulated (FM) signal is received at port 400 and applied to receiver front end 402, which generally comprises low noise amplifiers, automatic gain control amplifiers, filters, and downconversion mixers, all known in the art. After being processed by the receiver front end 402, the down-converted signal is applied to a conventional limiter circuit to limit the amplitude of the downconverted signal.

The amplitude limited signal is applied to digital FM demodulator 406. In addition, the aperiodic sample rate clock signal (produced at port 308 of FIG. 3) is applied to the digital FM demodulator 406. The digital FM demodulator 406 uses a phase digitizer to detect phase modulation from the amplitude limited signal. An approximation to a discriminator is obtained by performing a differential on the phase information to produce an demodulated digital signal. The digital FM demodulator 406 is similar to the digital FM demodulator shown in U.S. Pat. No. 5,661,433 which is commonly assigned to the assignee of the present invention and which is incorporated herein by reference. In an alternate embodiment, FM demodualtor 406 comprises a conventional descriminator. In another alternate embodiment, the FM demodulator 406 comprises a baseband quadrature demodulator. It will be recognized by those skilled in the art that other means of FM demodultion could be employed to produce the demodulated digital signal.

The demodulated digital signal is applied to hardware digital processing circuitry 408, which digitally performs functions such as filtering, de-emphasis, and expanding. The hardware digital processing circuitry 408 is similar to the hardware digital processing circuitry described in U.S. Pat. No. 5,903,825 which is commonly assigned to the assignee of the present invention. The aperiodic sample rate clock signal (produced at port 308 of FIG. 3) is applied to hardware digital processing circuitry 408. Using the aperiodic sample rate clock signal, the hardware digital processing circuitry 408 converts the demodulated digital signal from serial data to aperiodic parallel data, also referred to as aperiodic data. The aperiodic data is coupled over multiple lines, here shown as bus 412, to a sigma-delta demodulator 414.

In addition, the hardware digital processing circuitry conditions the aperiodic sample rate clock signal to produce an aperiodic load signal. The aperiodic load signal is substantially equal in frequency to the aperiodic sample rate clock signal but has a different duty cycle. The aperiodic load signal is coupled through line 410 to the sigma-delta demodulator 414.

The sigma-delta demodulator 414 uses the periodic oversample clock signal (produced at port 310 of FIG. 3) to convert the aperiodic data to an oversampled digital stream. The oversampled digital stream is applied to a conventional low pass filter 416 that filters high frequency noise and reconstructs an analog information signal. The analog information signal is applied to audio amplifier 418 to produce an amplified analog signal at port 420.

Figure 5:
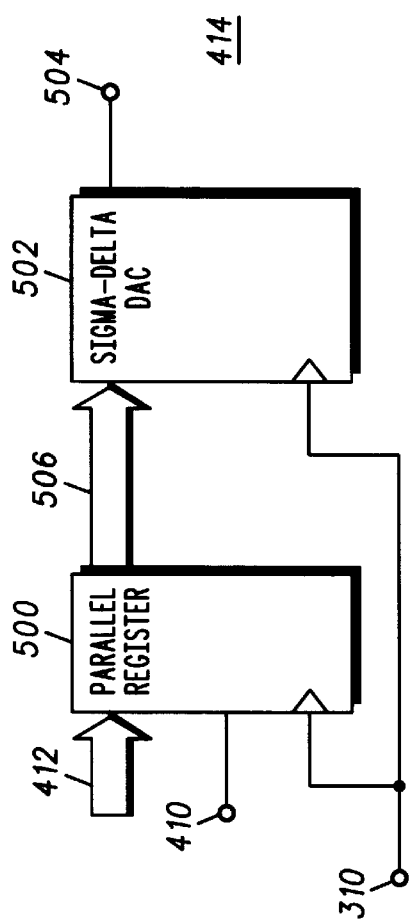
FIG. 5 is a block diagram of a sigma-delta demodulator apparatus in accordance with the present invention.

The sigma-delta demodulator 414 is shown in FIG. 5. The aperiodic data on bus 412 is applied to parallel register 500. Also applied to parallel register 500 is the aperiodic load signal appearing on line 410 and the periodic oversample clock signal on line 310. When a predetermined relationship between the aperiodic load signal and the periodic oversample clock signal occurs, the aperiodic data is produced at the parallel register output 506 as substantially periodic parallel data, also referred to as substantially periodic data. The substantially periodic data is loaded into a conventional sigma-delta DAC 502 for processing. The parallel register 500 is thus a converter means for receiving a periodic oversample clock signal, an aperiodic load signal, and aperiodic data, and producing substantially periodic data.

The data produced at the output of the parallel register 500 is referred to as substantially periodic data because the data is not always held for the same amount of clock cycles of the periodic oversample clock signal. For example, some words comprising the substantially periodic data are held at the output of the parallel register for a first number of clock cycles, while other words are held for a second number of clock cycles. In addition, other words may be held at yet other numbers of clock signals. Over time, the substantially periodic data is held at the output of the parallel register at an average number of clock cycles that is substantially equal to the oversampling ratio.

In the illustrated embodiment, the predetermined relationship occurs when the aperiodic load signal is asserted high and the periodic oversample clock signal is at a rising edge transition from asserted low to asserted high. In other embodiments, the predetermined relationship between the aperiodic load signal and the periodic oversample clock signal comprises other signal combinations. In addition, although the parallel register 500 is particularly advantageous when used to convert aperiodic data to substantially periodic data, it will be recognized by those skilled in the art that other means can be advantageously employed to convert aperiodic data to substantially periodic data.

The sigma-delta DAC 502 uses the periodic oversample clock signal on line 310 to generate a 1-bit oversampled, time averaged representation of the substantially periodic data. In reconstructing the analog signal, a continuous stream of pulses, each with equal magnitude, are generated by the sigma-delta DAC (A binary 1 output is mapped to a +1 pulse and a binary 0 is mapped to a −1 pulse). Since the oversampling rate is based on a periodic clock, the quality of the signal produced at output 504 is preserved, and the noise performance is significantly better than the noise performance that would otherwise be obtained if an aperiodic sampling clock signal was used to drive the sigma-delta DAC. The sigma-delta demodulator 414 is suitable for fabrication on an integrated circuit.

Figure 6:
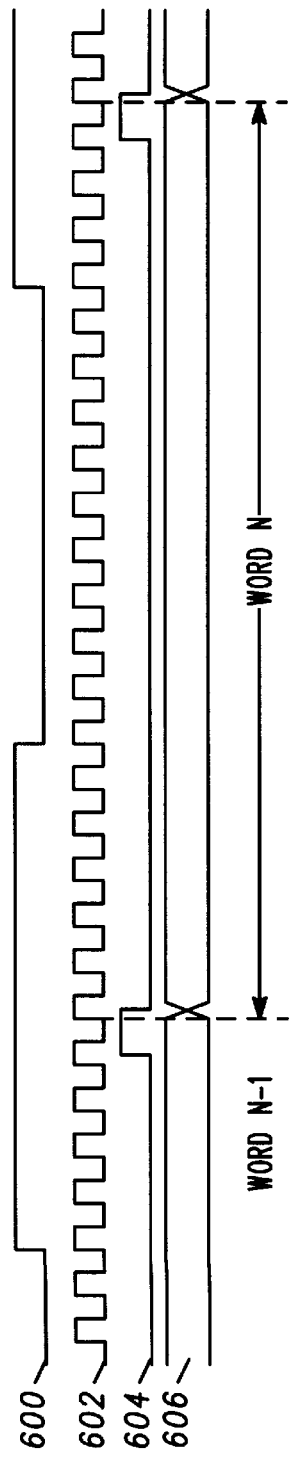
FIG. 6 illustrates possible waveforms for a sigma-delta demodulator apparatus.

Turning to FIG. 6, possible waveforms for the sigma-delta demodulator 414 is illustrated. Waveform 600 represents the aperiodic sample rate clock signal produced on line 308 of FIG. 3. Waveform 602 represents the periodic oversample clock signal produced on line 310 of FIG. 3. Waveform 602 thus represents the periodic oversample clock signal that drives the sigma-delta DAC 502. Waveform 604 represents the aperiodic load signal produced by hardware digital processing circuitry 408. Waveform 606 represents the substantially periodic data (referred to as a word in FIG. 6) that is loaded into the sigma-delta DAC 502 for processing. In the illustrated example of FIG. 6, the oversampling ratio (OSR) equals 20. The loading procedure will vary according to the implementation and architecture of the digital system, and various modifications to the loading procedure will be readily apparent to those skilled in the art.

To ensure that the proper OSR is maintained, the aperiodic load signal is generated such that the data is latched to the output of the parallel register once for every sample of aperiodic parallel data produced by the hardware digital processing circuitry 408. This will ensure that the sigma-delta DAC will operate over the entire data sample.

Figure 7:
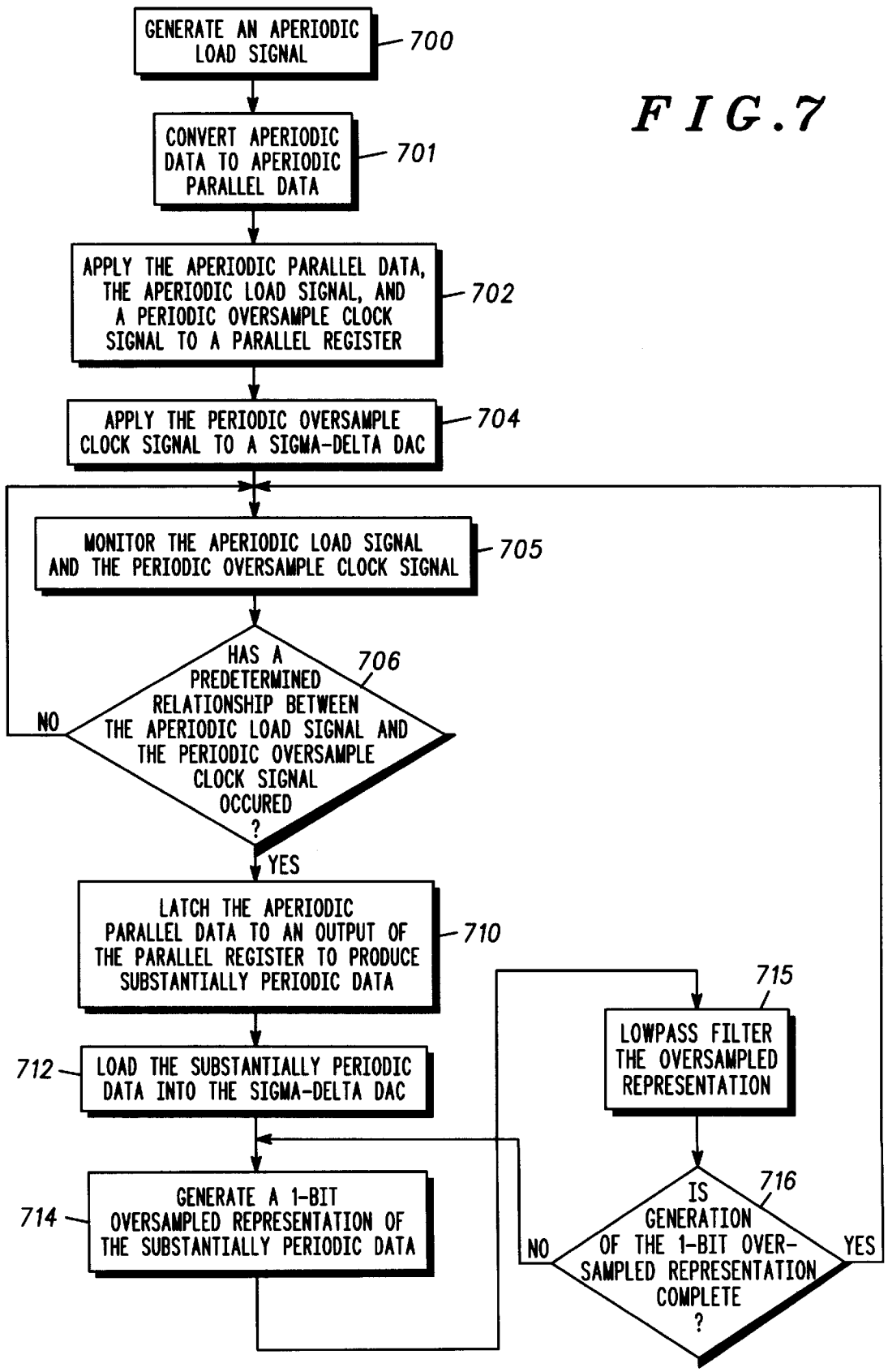
FIG. 7 is a flow chart illustrating a method of sigma-delta demodulation of a data generated from an aperiodic clock.

FIG. 7 is a flow chart illustrating a method of sigma-delta demodulation of data generated from an aperiodic clock. At block 700, an aperiodic load signal is generated using a binary rate multiplier generated clock, and at block 701 aperiodic data is converted to aperiodic parallel data. The step of converting the aperiodic data to aperiodic parallel data is not necessary if the aperiodic data is already in parallel form. At block 702, the aperiodic parallel data, the aperiodic load signal, and a periodic oversample clock signal are applied to a parallel register. The periodic oversample clock signal is applied to a sigma-delta DAC at block 704.

The aperiodic load signal and the periodic oversample clock signal are monitored at block 705. If it is determined at block 706 that a predetermined relationship between the aperiodic load signal and the periodic oversample clock signal has not yet occurred, the two signals are continuously monitored at block 705. If it is determined at block 706 that the predetermined relationship between the aperiodic load signal and the periodic oversample clock signal has occurred, then at block 710 the aperiodic parallel data is latched to the output of the parallel register to produce substantially periodic data. The substantially periodic data is loaded into a sigma-delta DAC at block 712.

At block 714, the sigma-delta DAC generates a 1-bit oversampled representation of the substantially periodic data, and the oversampled signal is low-pass filtered to produce a reconstructed analog signal at block 715. If at block 716 the oversampling of the substantially periodic data is not complete, the sigma-delta DAC continues to generate the 1-bit oversampled representation at block 714. If at block 716 the oversampling of the substantially periodic data is complete, the aperiodic load signal and the periodic oversample clock signal are monitored at block 705 to determine when the next aperiodic parallel data should be latched to the output of the parallel register.

A sigma-delta demodulator apparatus in accordance with the present invention has several advantages over conventional sigma-delta demodulators when used to process aperiodic data. The combination of a parallel register with a sigma-delta DAC enables aperiodic data to first be latched by the parallel register when loaded into the sigma-delta DAC. This allows the sigma-delta DAC to be driven by a periodic oversample clock, which results in each pulse produced by the sigma-delta DAC to be of equal amplitude and duration. Thus, an accurate reconstruction of the analog signal can be reproduced (after low-pass filtering) without a significant degradation in the signal to noise level. Preventing degradation in signal to noise level will result, for example, in a more robust, higher fidelity wireless communication system. In addition, only one crystal oscillator is needed to generate all of the subclocks needed for a system, since BRM generated clock signals can be used.

Figure 8:
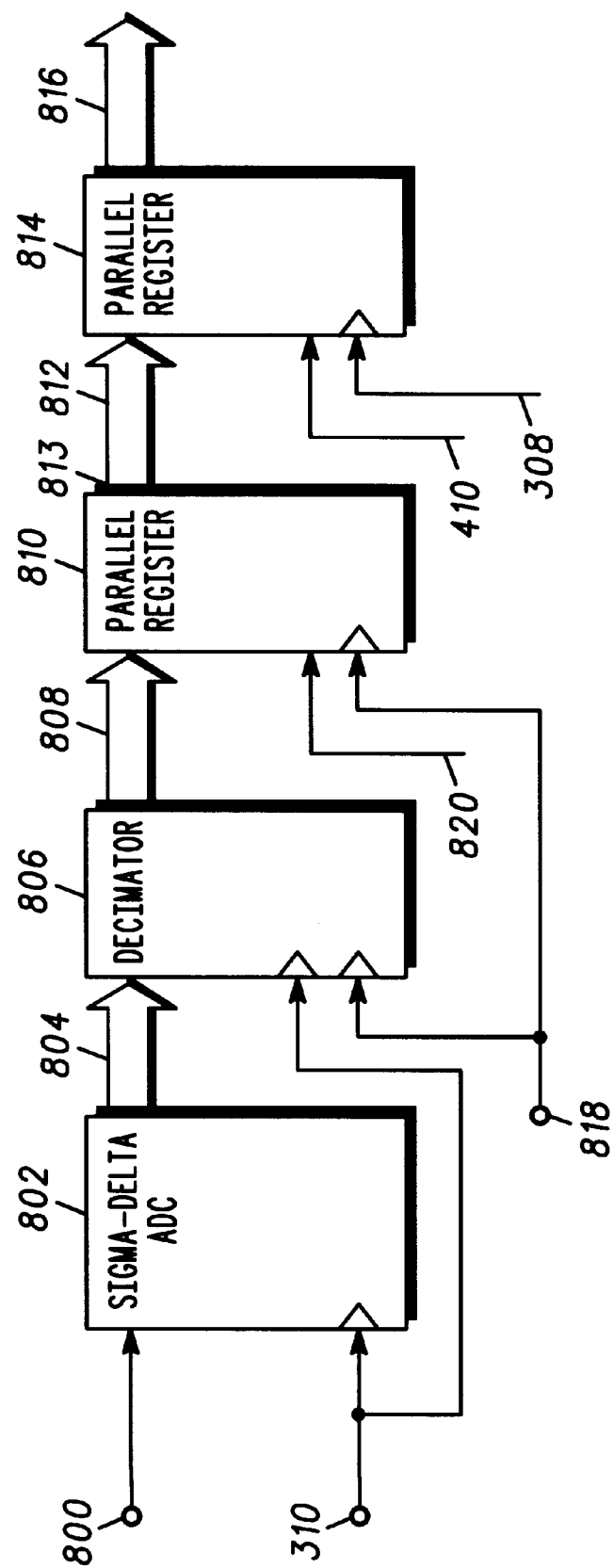
FIG. 8 is a block diagram of a sigma-delta modulator for generating aperiodic data.

FIG. 8 is a block diagram that illustrates a sigma-delta modulator for generating aperiodic data. An analog signal is applied through input 800 to a sigma-delta analog-to-digital converter (ADC) 802. A periodic oversample clock signal (produced at port 310 of FIG. 3) is applied to the sigma-delta ADC, and a periodic parallel (multiple bit) digital representation of the analog signal is produced on bus 804.

The periodic parallel digital representation is applied through bus 804 to a conventional decimator 806 which is driven by the periodic oversample clock signal and a periodic sample clock signal appearing on line 818. The decimator 806 generally comprises a conventional downsampler for producing downsampled data and a low-pass digital filter to remove the high frequency components of the downsampled data. The decimator 806 produces decimated periodic parallel data that is produced on bus 808.

In an alternate embodiment, the output from the sigma-delta ADC comprises serial data that is converted to parallel data with a serial-to-parallel converter before being applied to the decimator 806. In another alternate embodiment, the output from the sigma-delta ADC comprises serial data, and the decimator downsamples the serial data to produce periodic serial data that is then converted to parallel data with a conventional serial-to-parallel converter.

The decimated periodic parallel data is applied through bus 808 to a first parallel register 810. The first parallel register 810 is driven by a periodic load signal appearing on line 820 and the periodic sample clock signal appearing on line 818. When a predetermined relationship between the periodic load signal and the periodic sample clock signal occurs, the decimated periodic parallel data is latched to an output 813 of first parallel register 810 as latched periodic parallel data.

The latched periodic parallel data is applied through bus 812 to a second parallel register 814. The second parallel register 814 is driven by the aperiodic load signal through line 410 and the aperiodic sample rate clock signal (produced at port 308 of FIG. 3). When a predetermined relationship between the aperiodic load signal and the aperiodic sample rate clock signal occurs, wherein the aperiodic load signal is offset from the periodic load signal, the latched periodic parallel data is latched to output 816 as aperiodic parallel data.

The previous description of the preferred embodiments are provided to enable any person skilled in the art to make or use the sigma-delta demodulator apparatus. Various modifications to these embodiments will be readily apparent to those skilled in the art, and the generic principles defined herein may be applied to other embodiments without the use of the inventive faculty. For example, the receiver architecture described here is that of an FM communication system with all digital demodulation. The sigma-delta demodulator can also be used in conjunction with other communication systems, such as digital time-division multiple access and code-division multiple access systems.

What is claimed is:

1. A sigma-delta demodulator apparatus comprising:
    a parallel register configured to receive a periodic oversample clock signal, an aperiodic load signal, and aperiodic data, the parallel register producing substantially periodic data when a predetermined relationship between the periodic oversample clock signal and the aperiodic load signal occurs; and
    a sigma-delta digital-to-analog converter configured to receive the periodic oversample clock signal and processing the substantially periodic data to produce a time averaged representation of the substantially periodic data.

2. The sigma-delta demodulator apparatus as in claim 1 further comprising a crystal oscillator for generating a master clock signal having a master clock frequency, the periodic oversample clock signal, the aperiodic load signal, and the aperiodic data generated in response to the master clock signal.

3. The sigma-delta demodulator apparatus as in claim 2 further comprising a binary rate multiplier for generating a binary rate multiplied signal that is a ratio of the master clock frequency, the aperiodic load signal and the aperiodic data generated in response to the binary rate multiplied signal.

4. The sigma-delta demodulator apparatus as in claim 3 further comprising a low-pass filter for filtering the time averaged representation of the substantially periodic data.

5. A method of sigma-delta demodulation comprising the steps of:
    applying aperiodic data, an aperiodic load signal, and a periodic oversample clock signal to a parallel register;
    applying the periodic oversample clock signal to a sigma-delta digital-to-analog converter;
    monitoring the aperiodic load signal and the periodic oversample clock signal;
    latching the aperiodic data to an output of the parallel register to produce substantially periodic data;
    loading the substantially periodic data into the sigma-delta digital-to-analog converter; and
    generating an oversampled representation of the substantially periodic data.

6. The method of sigma-delta demodulation as in claim 5 wherein the step of latching the aperiodic data to the output of the parallel register to produce the substantially periodic data is performed when a predetermined relationship between the periodic oversample clock signal and the aperiodic load signal occurs.

7. The method of sigma-delta demodulation as in claim 6 further comprising the step of low-pass filtering the oversampled representation of the substantially periodic data to produce a reconstructed analog signal.

8. The method of sigma-delta demodulation as in claim 7 further comprising the step of generating the aperiodic load signal using a binary rate multiplier generated clock.

9. A radiotelephone comprising:
    a control logic for controlling the radiotelephone;
    a synthesizer for generating RF signals;
    a transmitter for transmitting transmit data using the RF signals;
    a receiver for receiving receive data using the RF signals, the receiver including:
        a parallel register configured to receive a periodic oversample clock signal, an aperiodic load signal, and aperiodic data, the parallel register producing substantially periodic data when a predetermined relationship between the periodic oversample clock signal and the aperiodic load signal occurs; and
        a sigma-delta digital-to-analog converter configured to receive the periodic oversample clock signal and processing the substantially periodic data to produce a time averaged representation of the substantially periodic data.

10. The radiotelephone as in claim 9 further comprising a crystal oscillator for generating a master clock signal having a master clock frequency, the periodic oversample clock signal, the aperiodic load signal, and the aperiodic data generated in response to the master clock signal.

11. The radiotelephone as in claim 10 further comprising a binary rate multiplier for generating a binary rate multiplied signal that is a ratio of the master clock frequency, the aperiodic load signal and the aperiodic data generated in response to the binary rate multiplied signal.

12. The radiotelephone as in claim 11 further comprising a low-pass filter for filtering the time averaged representation of the substantially periodic data.

13. A method of sigma-delta demodulation comprising the steps of:
    receiving aperiodic data, an aperiodic load signal, and a periodic oversample clock signal;
    monitoring the aperiodic load signal and the periodic oversample clock signal;
    converting the aperiodic data to substantially periodic data; and
    generating an oversampled representation of the substantially periodic data.

14. The method of sigma-delta demodulation as in claim 13 wherein the step of converting the aperiodic data to substantially periodic data is performed when a predetermined relationship between the periodic oversample clock signal and the aperiodic load signal occurs.

15. The method of sigma-delta demodulation as in claim 14, wherein the step of receiving aperiodic data, an aperiodic load signal, and a periodic oversample clock signal is performed using a parallel register.

16. A sigma-delta demodulator apparatus comprising:
    converter means for receiving a periodic oversample clock signal, an aperiodic load signal, and aperiodic data, the converter means producing substantially periodic data; and
    a sigma-delta digital-to-analog converter configured to receive the periodic oversample clock signal and processing the substantially periodic data to produce a time averaged representation of the substantially periodic data.

17. The sigma-delta demodulator apparatus as in claim 16, wherein the substantially periodic data is produced when a predetermined relationship between the periodic oversample clock signal and the aperiodic load signal occurs.

18. The sigma-delta demodulator apparatus as in claim 17, wherein the converter means comprises a parallel register.

* * * * *